United States Patent
Nakamura et al.

(10) Patent No.: US 6,822,233 B2
(45) Date of Patent: Nov. 23, 2004

(54) METHOD AND APPARATUS FOR SCANNING TRANSMISSION ELECTRON MICROSCOPY

(75) Inventors: Kuniyasu Nakamura, Musashino (JP); Hiroshi Kakibayashi, Nagareyama (JP); Mikio Ichihashi, Kodaira (JP); Shigeto Isakozawa, Hitachinaka (JP); Yuji Sato, Hitachinaka (JP); Takahito Hashimoto, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/346,138

(22) Filed: Jan. 17, 2003

(65) Prior Publication Data

US 2003/0127595 A1 Jul. 10, 2003

Related U.S. Application Data

(63) Continuation of application No. 09/259,334, filed on Mar. 1, 1999, now Pat. No. 6,531,697.

(30) Foreign Application Priority Data

Mar. 2, 1998 (JP) .......................................... 10-093934

(51) Int. Cl.[7] .............................................. H01J 37/04
(52) U.S. Cl. ..................................... 250/311; 250/310
(58) Field of Search ................................ 250/423, 305, 250/306, 302, 309, 310, 311, 307, 308, 397

(56) References Cited

U.S. PATENT DOCUMENTS

| | | | |
|---|---|---|---|
| 4,588,891 A | | 5/1986 | Saito |
| 4,814,615 A | * | 3/1989 | Fushimi et al. ............. 250/311 |
| 5,134,289 A | | 7/1992 | Murakoshi et al. |
| 5,300,776 A | * | 4/1994 | Krivanek .................... 250/307 |
| 5,477,049 A | | 12/1995 | Kitamura |
| 5,502,306 A | * | 3/1996 | Meisburger et al. ........ 250/310 |
| 5,552,602 A | | 9/1996 | Kakibayashi et al. |
| 5,578,821 A | | 11/1996 | Meisberger et al. |
| 5,866,905 A | | 2/1999 | Kakibayashi et al. |

FOREIGN PATENT DOCUMENTS

| | | |
|---|---|---|
| JP | 62-16160 | 2/1977 |
| JP | 57-36763 | 2/1982 |
| JP | 60-151946 | 8/1985 |
| JP | 08-329876 | 12/1996 |

* cited by examiner

*Primary Examiner*—John P. Lee
*Assistant Examiner*—David A. Vanore
(74) *Attorney, Agent, or Firm*—Mattingly, Stanger & Malur, P.C.

(57) ABSTRACT

A scanning transmission electron microscope (STEM) has an electron source for generating a primary electron beam and an electron illuminating lens system for converging the primary electron beam from the electron source onto a specimen for illumination. An electron deflecting system is provided for scanning the specimen with the primary electron beam. The STEM also has a scattered electron detector for detecting scattered electrons transmitted through the specimen. A projection lens system projects the scattered electrons onto a detection surface of the scattered electron detector. An image displaying device displays the scanning transmission electron microscope image of the specimen using a detection signal from the scattered electron detector. A detection angle changing device for establishes the range of the scattering angle of the scattered electrons detected by the scattered electron detector. This structure enhances the contrast of a desired portion of the specimen under observation for a scanning transmitted image by selective establishment of detection angle ranges for the scattered electron detector.

1 Claim, 14 Drawing Sheets

F I G. 1
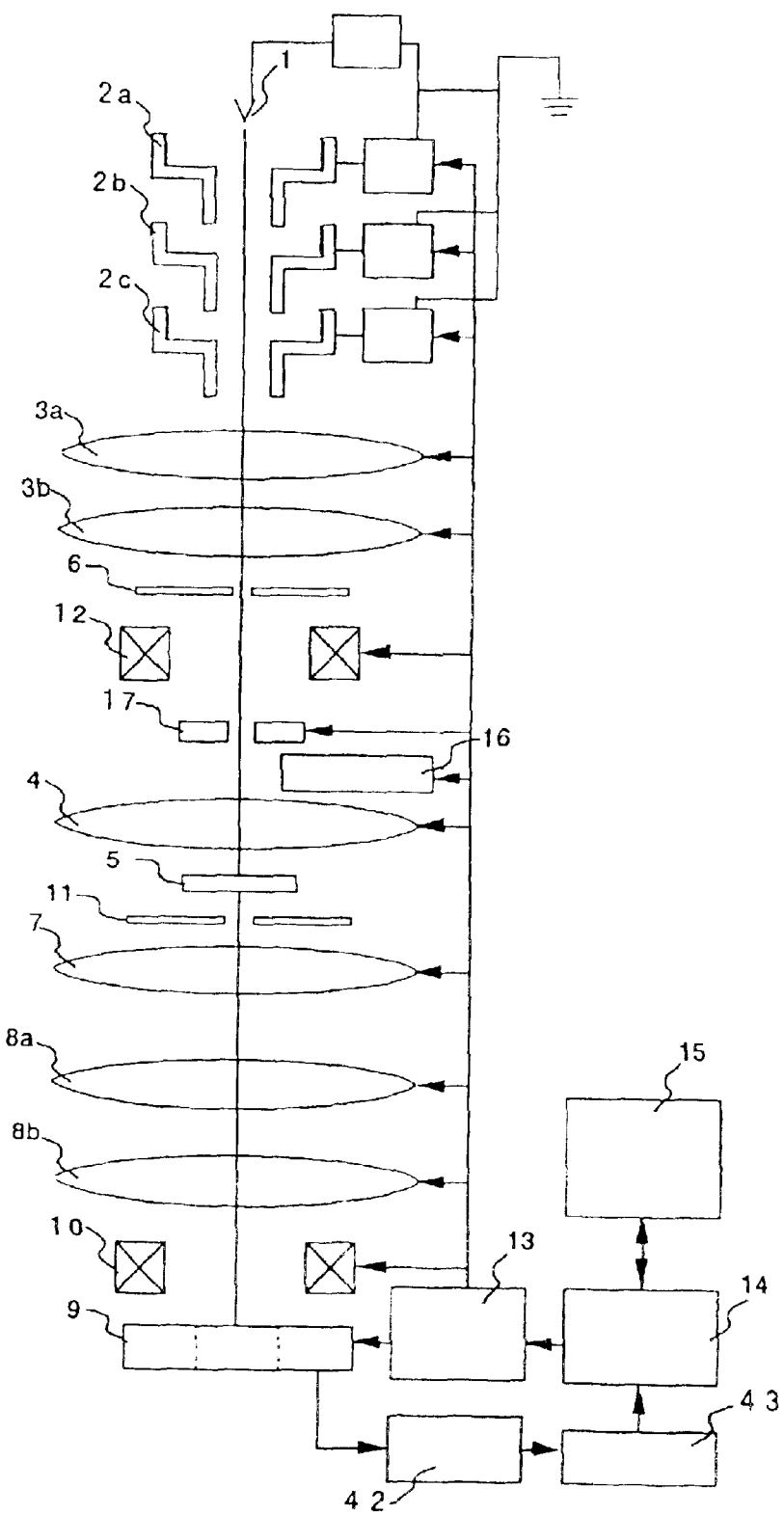

F I G. 7
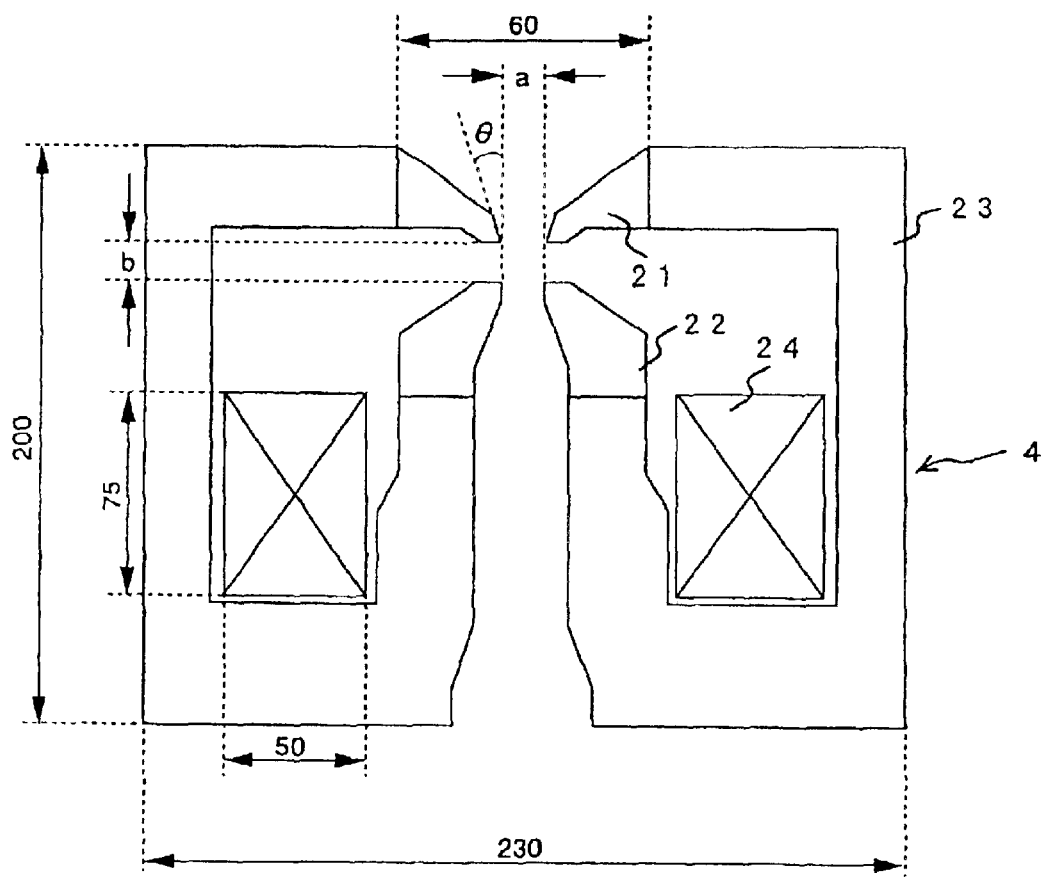

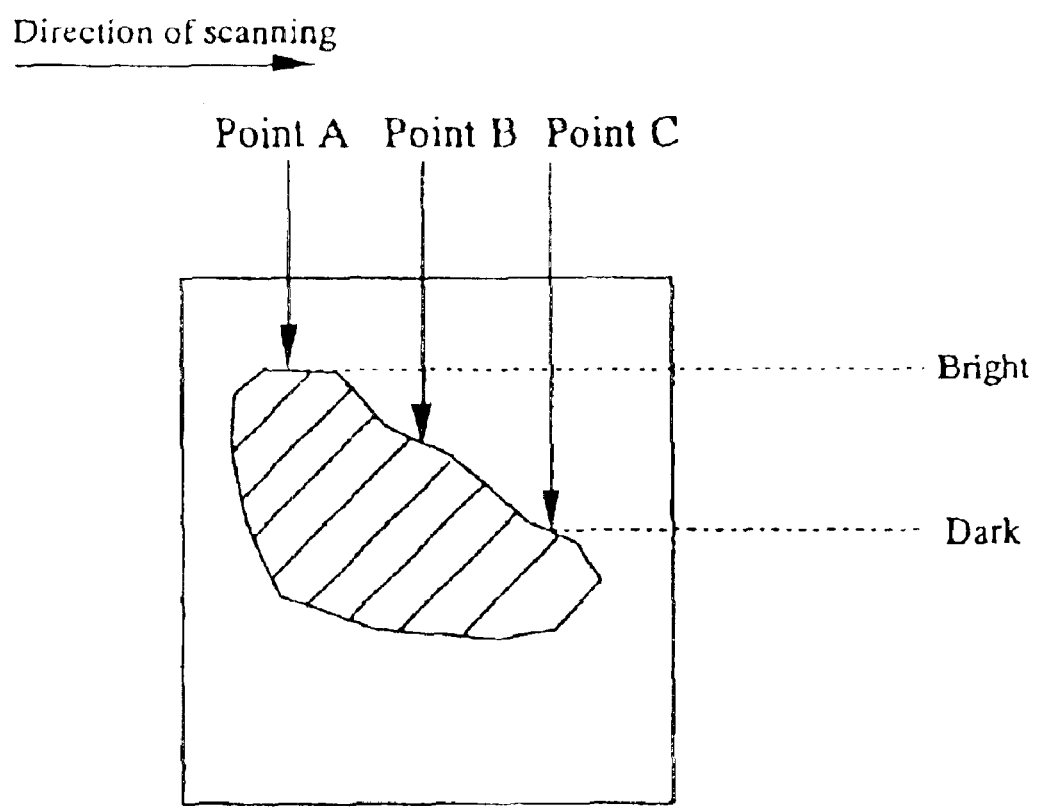
F I G. 1 0

F I G. 1 5
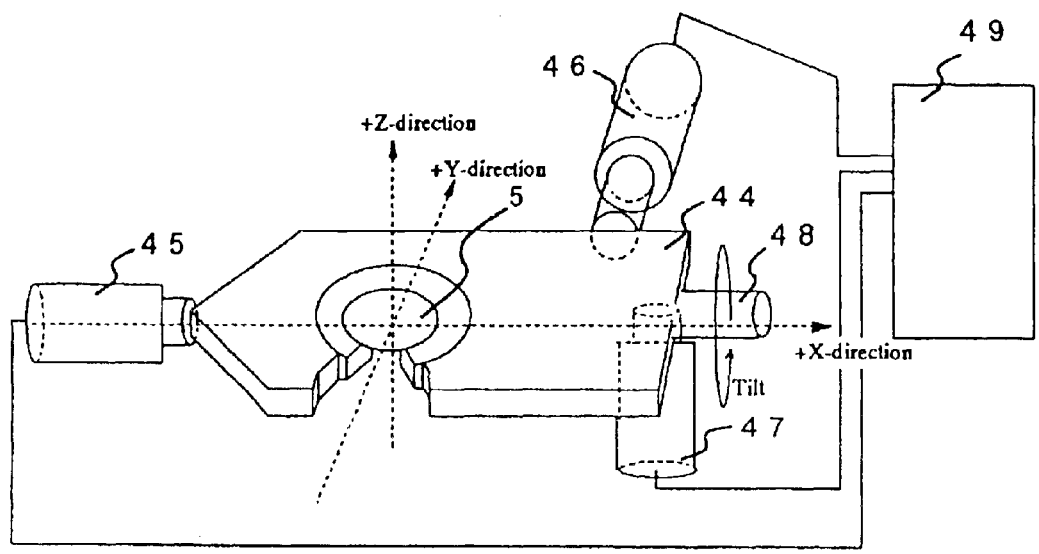

METHOD AND APPARATUS FOR SCANNING TRANSMISSION ELECTRON MICROSCOPY

This is a continuation application of U.S. Ser. No. 09/259,334, filed Mar. 1, 1999 now U.S. Pat. No. 6,531,697.

BACKGROUND OF THE INVENTION

The present invention relates to a scanning transmission electron microscope and a method of scanning transmission electron microscopy applicable to the scanning transmission electron microscope which offers substantially the same ease of operation as that of scanning electron microscopes and which provides substantially the same degree of resolution as that of transmission electron microscopes.

A scanning transmission electron microscope (STEM) based on a conventional transmission electron microscope (TEM) is disclosed illustratively in Japanese Patent Laid-open No. 016160/1977. Japanese Patent Laid-open No. 036763/1982 discloses structures of a secondary electron detector for use with a TEM-based STEM. With TEM-based STEMs, the axial alignment of their electron lens system is accomplished conventionally using a fluorescent screen in a dark room to observe electron beam paths.

Expectations were high for the advent of scanning transmission electron microscopes (STEM) which have levels of resolution as high as those of transmission electron microscopes (TEM) and which may be operated as easily as scanning electron microscopes (SEM). The above-mentioned TEM-based STEM can be a bulky machine about 2.5 m in height to house a complicated electron lens system for imaging diffraction patterns derived from transmitted electrons. Where to install such a tall TEM-based STEM has turned out to be a problem. With the TEM-based STEM, images have often been observed by use of a fluorescent screen, which requires a dark room. Furthermore, an experienced operator's skills and knowledge have been necessary for the alignment of the optical axis of the TEM-based STEM.

Meanwhile, the scanning transmission electron microscope (STEM) based on scanning electron microscopes (SEM) has no image-magnifying lens system. That means the alignment of an electron lens system is not available on the SEM-based STEM. In addition, the SEM-based STEM is lacking in the ease of operation in that the preparation and attachment of specimens as well as the feeding of operating instructions to the machine cannot be accomplished on a display screen.

SUMMARY OF THE INVENTION

It is therefore an object of the present invention to provide a scanning transmission electron microscope (STEM) which has a level of resolution as high as that of transmission electron microscopes (TEM) and which may be operated as easily as scanning electron microscopes (STEM).

It is another object of the invention to provide a scanning transmission electron microscope (STEM) which permits the observation of scanning transmitted images of specimens in a well-lighted room.

It is a further object of the invention to provide a scanning transmission electron microscope (STEM) allowing the optical axis of a primary electron beam to be adjusted easily for observation purposes.

It is an even further object of the invention to provide an interactive input/output device which is used in conjunction with a scanning transmission electron microscope (STEM). The interactive input/output device facilitates the observation of scanning transmitted images of specimens on the microscope.

It is a still further object of the invention to provide a method of scanning electron microscopy which is for use with a scanning transmission electron microscope (STEM). The method allows internal structures of specimens to be observed in a three-dimensional fashion.

In achieving the foregoing and other objects of the present invention, there is provided a scanning transmission electron microscope comprising; an electron source for generating a primary electron beam; an electron illuminating lens system for converging the primary electron beam from the electron source onto a specimen for illumination; an electron deflecting system for scanning the specimen with the primary electron beam emitted thereto; a scattered electron detector for detecting scattered electrons transmitted through the specimen; and an image displaying system for displaying a scanning transmission electron microscope image of the specimen using a detection signal from the scattered electron detector. This inventive structure provides effectively a scanning transmission electron microscope (STEM) based on a scanning electron microscope (SEM).

In a preferred structure according to the invention, the scanning transmission electron microscope (STEM) may further comprise a detection angle changing system for variably establishing a range of scattering angle of the scattered electrons detected by the scattered electron detector. This preferred structure enhances a contrast of a desired portion of the specimen under observation for a scanning transmitted image, thereby improving the precision of structural and component analyses of the specimen.

In another preferred structure according to the invention, the scanning-transmission electron microscope (STEM) may further comprise a PC-based interactive input/output device with a display screen permitting input of conditions for operating components of the scanning transmission electron microscope. This structure renders the microscope easier to operate and thereby alleviates users' operating chores.

In a further preferred structure according to the invention, the scanning transmission electron microscope (STEM) may further comprise a secondary electron image displaying system for displaying a secondary electron image of the specimen through detection of secondary electrons released by the specimen, and/or reflected electron image displaying means for displaying a reflected electron image of the specimen through detection of reflected electrons from the specimen. This preferred structure provides more aspects of observed information about the specimen by supplementing its scanning transmitted image with a secondary electron image and/or a reflected electron image.

In an even further preferred structure according to the invention, the electron illuminating lens system may include accelerating electrostatic lenses for accelerating the primary electron beam from the electron source, and converging lenses for converging the accelerated primary electron beam onto the specimen. The electron illuminating lens system may further include an electron source deflector for aligning an optical axis of the primary electron beam from the electron source. The electron source deflector may be constituted illustratively by a scanning deflector and by two-stage deflectors with reversal polarity which are located above and below the scanning deflector.

These and other objects, features and advantages of the invention will become more apparent upon a reading of the following description and appended drawings.

BRIEF DESCRIPTION OF THE DRAWINGS

FIG. 1 is a schematic view of a scanning transmission electron microscope (STEM) practiced as an embodiment of this invention;

FIG. 7 is a schematic view indicating approximate dimensions of an objective lens included in the STEM of FIG. 6;

FIG. 10 is a schematic view for explaining changes in a contrast of a secondary electron image, the changes being attributable to different depths in a specimen;

FIG. 15 is a schematic view showing a typical setup of a specimen holder and a specimen stage.

DETAILED DESCRIPTION OF THE PREFERRED EMBODIMENTS

Figure 2:
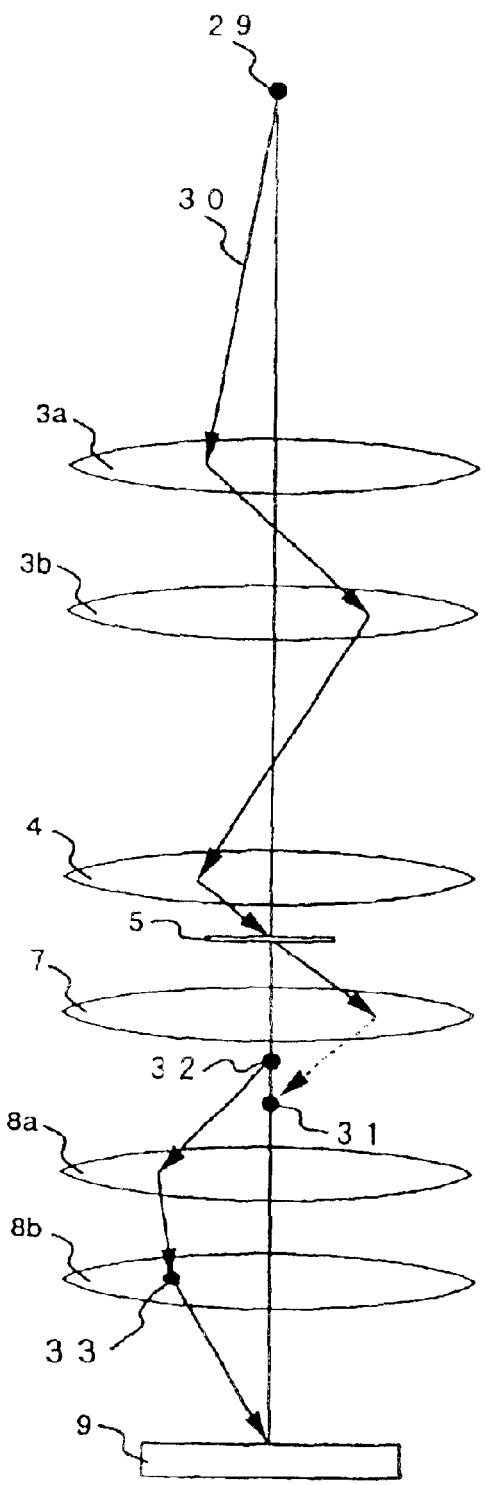
FIG. 2 is an electron ray diagram for explaining electron optical functions of the STEM in FIG. 1.

Preferred embodiments of this invention will now be described in detail with reference to the accompanying drawings.

Described first are ways to acquire a scanning transmitted image of a specimen by use of a scanning transmission electron microscope (STEM) based on a scanning electron microscope (SEM) to detect scattered electrons having a given range of scattering angle.

FIG. 1 schematically shows a scanning transmission electron microscope (STEM) embodying the invention. An electron beam from an electron source 1 is accelerated to a predetermined acceleration voltage by multi-stage electrostatic lenses 2a, 2b and 2c. The acceleration voltage per stage is set for about 30 kV, and the voltage applied to the lens electrode at each stage is varied. This setup allows an ultimate acceleration voltage for the electron beam to be varied.

The electron beam thus accelerated up to the predetermined acceleration voltage is converged (demagnified) by a first and a second stage converging lens 3a and 3b. The demagnification of the electron beam may be altered as needed by changing the variation of exciting currents to the first and the second stage converging lens 3a and 3b.

The electron beam is further demagnified by a strongly excited pre-field objective lens 4. Finally, an electron probe having a subnanometer-order diameter is formed on a specimen 5. A convergence aperture 6 under the second stage converging lens 3b is used to change the probe in its convergence angle, thereby balancing diffraction aberration with spherical aberration in connection with the probe diameter. Electrons transmitted through and scattered by the specimen 5 form an electron diffraction pattern under the specimen 5. A post-field objective lens 7 is strongly excited so that the diffraction pattern mentioned above is projected under the lens with virtually no magnification. Exciting currents fed to a first and a second stage projection lens 8a and 8b under the post-field objective lens 7 are adjusted so as to vary the magnification of the electron diffraction pattern for projection onto a scattered electron detector 9.

The scattered electron detector 9 is a detector which, incorporating a CCD, a harpicon camera or the like, provides high sensitivity, a high signal-to-noise ratio and high linearity and which quantitatively measures the intensity of scanning transmitted images. The detector 9 is of an annular shape made of a disk having a concentric hole (or cover) at its center. The shape of the detector 9 is designed to exclude low angle scattering components of electrons from a target to be detected. Alternatively, a disk-shaped detector 9 may have a cover arranged to cover the low angle scattering components bound for the detector center. A detector alignment coil 10 under the second stage projection lens 8b is used to align the detector 9 axially with the electron diffraction pattern.

An objective aperture 11 is located on an image plane formed for an electron diffraction pattern under the specimen 5. The aperture 11 has its diameter changed in a plurality of steps. Alternatively, the aperture 11 may be formed by one of a plurality of (e.g, four) interchangeable holes (circular openings) with different diameters. A desired hole may be selected from the optional holes and installed as needed. The objective aperture 11 determines a maximum angle at which to detect an electron diffraction pattern. That is, a minimum range for detecting scattered electrons (i.e., minimum angle) is determined by two factors: the magnification of the scattered electron detector 9 detecting an electron diffraction pattern, determined by the exciting currents fed to the first and the second projection lens 8a and 8b; and the physical inner diameter of the scattered electron detector 9. A maximum range for detecting scattered electrons (maximum angle) is determined by the diameter of the objective aperture 11.

A scanning transmitted image is acquired by scanning the specimen 5 two-dimensionally with the probe using a deflector coil 12 and by modifying the brightness of the scanning transmitted image on a CRT using a detection signal from the scattered electron detector 9 in synchronism with the scanning. More specifically, electron intensity signals representing diffraction patterns acquired in various scanned positions are detected as a contrast signal of a scanning transmitted image. An image is displayed through an image reproducing process synchronized with the above scanning (i.e., with a scanning or a deflection signal), whereby a scanning transmitted image of the specimen is acquired. Intensity levels of diffraction patterns in different scanned positions on the specimen 5 are magnified by a pre-amplifier 42 and converted to digital signals by an A/D converter 43. The digital signals thus converted are stored as a digital image file in a storage device (not shown). Contents of the image file are retrieved by a CPU 14 and sent to image display equipment in an interface 15. The image display equipment displays the scanning transmitted image of the specimen 5.

All lenses, coil components and detectors are operated by means of a D/A converter 13 under control of the CPU 14. Conditions for operating the components are established by an operator using the interface 15. A secondary electron detector 16 and a reflected electron detector 17 are located above the pre-field objective lens 4. The two detectors are used to acquire a scanning secondary electron image and a scanning reflected electron image at the same time as the above-described scanning transmitted image.

Below is a description of an electron lens system for imaging a scanning transmitted image, a scanning secondary electron image and a scanning reflected electron image. FIG. 2 is an electron ray diagram that geometrically illustrates optical paths of an electron beam 30 emitted from a virtual source 29 for imaging onto the detector 9. The virtual source 29 is not to be equated with a physical position of the electron source 1; rather, the source 29 stands for an effective electron source position determined by the extracting voltage and the radius of curvature of a tip that works as an electron source. An electron beam 30 from the virtual source 29 is demagnified or magnified by the first and the second converging lens 3a and 3b before entering the objective lens. The objective lens as used herein signifies a single lens formed by a single magnetic circuit. Optically, however, the objective lens plays two parts: one to demagnify the electron beam 30, and another to form an image out of the electrons scattered by the specimen. The pre-field objective lens 4 plays the demagnifying part, the post-field objective lens 7 the imaging part.

The electron beam 30 demagnified by the pre-field objective lens 4 falls onto and enters the specimen 5. At this point, part of the electron beams 30 are transmitted through the specimen 5 and emitted from its bottom, and part of the electron beams 30 are reflected inside the specimen 5 and emitted from its top. Upon emission of the reflected electrons, secondary electrons are released from the surface of the specimen 5. The secondary and the reflected electrons are detected and formed into a secondary and a reflected electron image respectively. The electrons transmitted through the specimen 5 are imaged by the post-field objective lens 7 onto a probe image plane 31.

On a back focal plane 32 of the post-field objective lens 7 is formed an electron diffraction pattern which reflects phase information about the electrons diffracted by the specimen 5. The first stage projection lens 8a is focused on the back focal plane 32 for the electron diffraction pattern. An image plane 33 of the first stage projection lens 8a is focused by the second-stage projection lens 8b onto the scattered electron detector 9. Varying the exciting current to the second stage projection lens 8b magnifies or demagnifies the image formed on the scattered electron detector 9. This in turn makes it possible for the scattered electron detector 9 to establish the range for detecting scattered electrons as desired.

Figure 3:
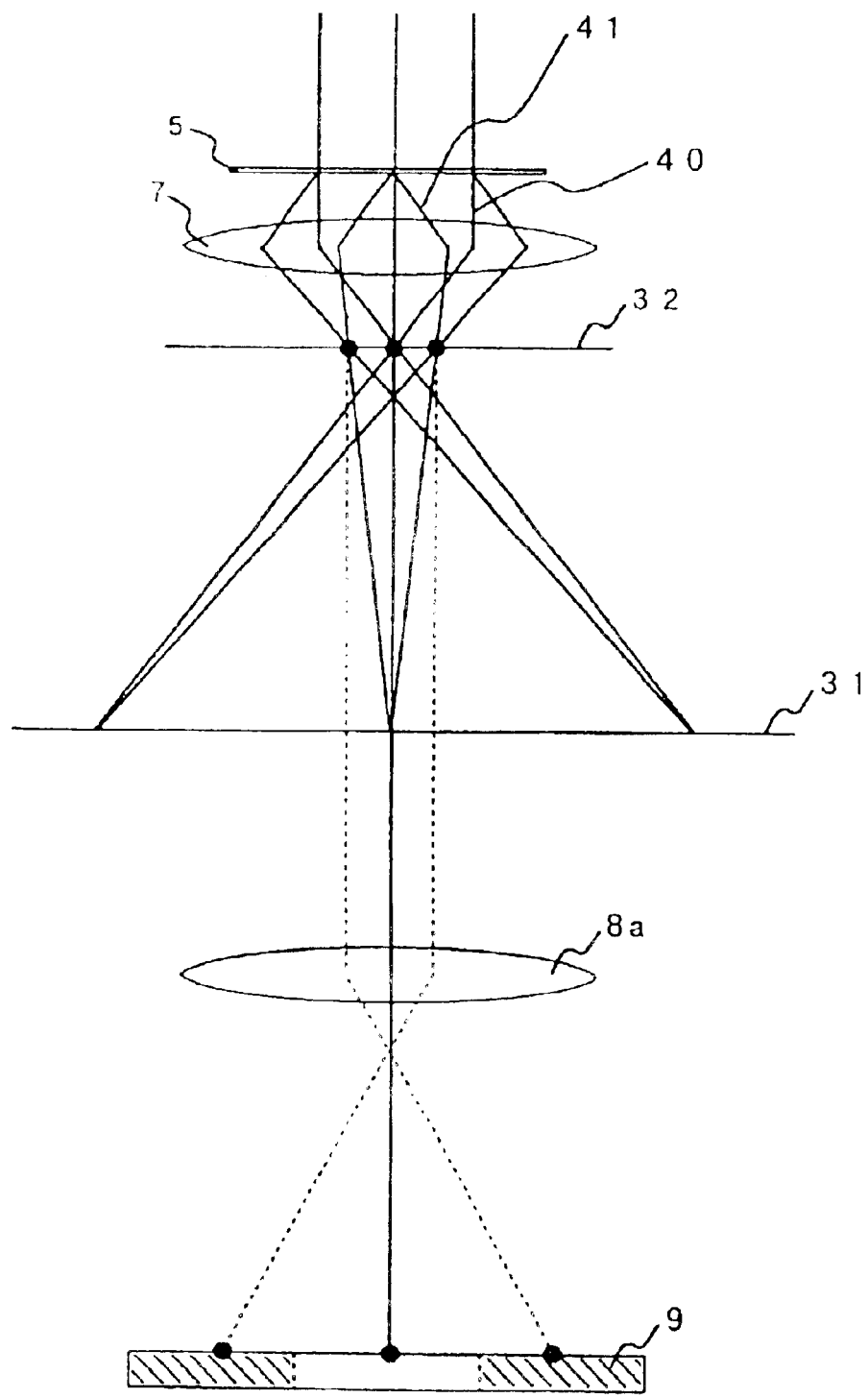
FIG. 3 is an electron ray diagram for explaining electron optical functions of components ranging from a specimen to a scattered electron detector in the STEM of FIG. 1.

FIG. 3 is an electron ray diagram showing how electrons diffracted by the specimen 5 are arranged to form the probe image plane 31 and back focal plane 32 by the post-field objective lens 7. Transmitted electrons 40 propagating in parallel with the direction of probe incidence, and diffracted electrons 41 propagating in different directions, are altered as illustrated in their propagating directions by the post-field objective lens 7.

On the back focal plane 32, the electrons propagating in the same direction past the specimen 5 are converged onto a single spot. That is, on the back focal plane 32 is formed a diffraction pattern wherein electrons are scattered depending on the angle of diffraction inside the specimen 5. The electrons transmitted through the specimen 5 form, between the post-field objective lens 7 and the first stage projection lens 8a, the probe image plane 31 corresponding on a one-to-one basis to a physical surface of the specimen 5. An image formed on the probe image plane 31 during the parallel scanning of the specimen 5 using the probe beam moves in parallel in synchronism with the probe beam scanning, whereas the diffraction image on the back focal plane 32 does not move. Thus to observe a scanning transmitted image need only require that the first stage projection lens 8a be focused on the back focal plane 32 to extract information dependent on the probe position, and that the electron diffraction pattern appearing on the back focal plane 32 be formed on the scattered electron detector 9.

Figure 4:
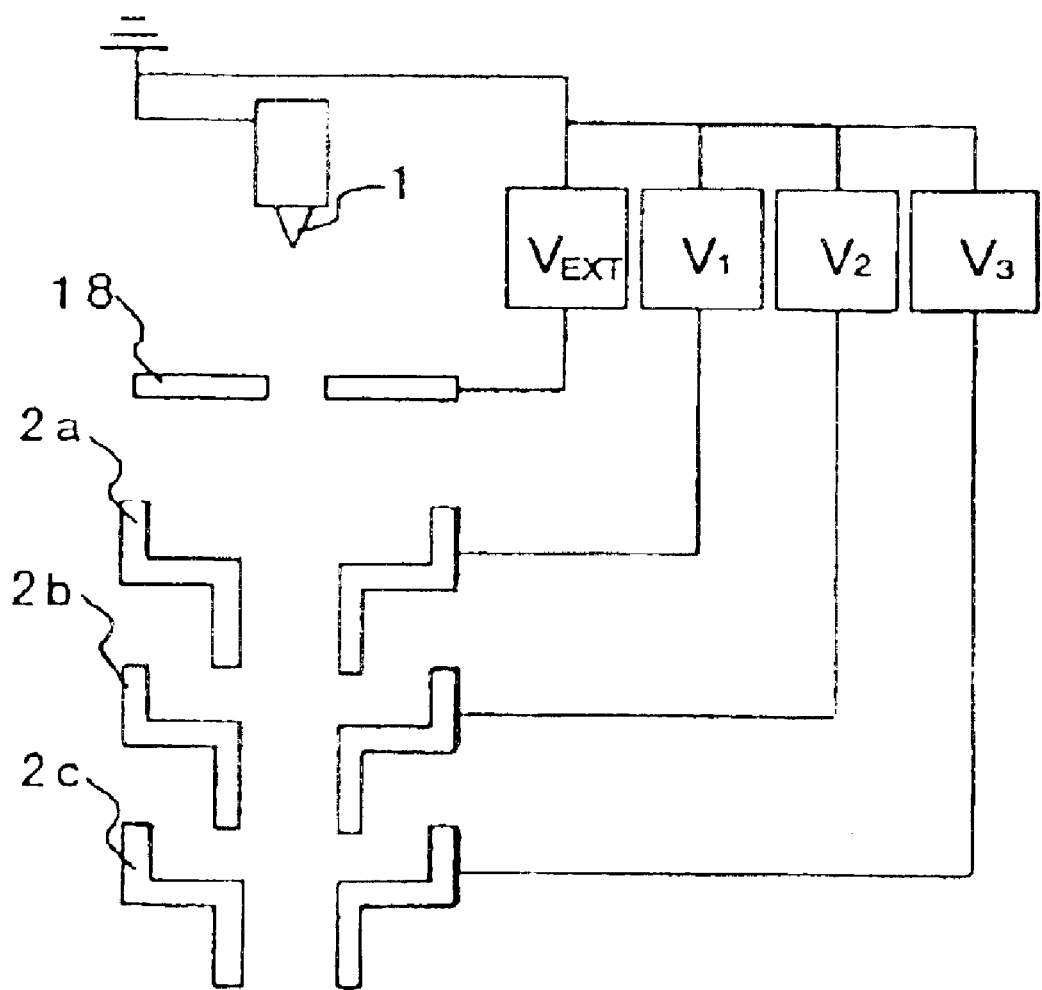
FIG. 4 is a schematic view illustrating a distribution of voltage supplies and their connections to electrostatic lenses for variable adjustment of an electron acceleration voltage in the STEM of FIG. 1.

What follows is a description of how to vary the acceleration voltage for an electron beam generated by the electron source 1. FIG. 4 schematically illustrates a typical structure of an electron gun. The electron gun is shown comprising an electron source 1 and electrostatic lenses 2a, 2b and 2c in a three-stage arrangement, each of the lenses being connected to a supply voltage. The electron source 1 is electrically grounded. The grounding is provided independent of an electrical ground of the microscope. A first anode 18 is fed with an extracting voltage $V_{EXT}$ (about ±5 kV) so as to extract an electron beam from the electron source 1. The first, the second and the third stage electrostatic lens 2a, 2b and 2c are supplied respectively with acceleration voltages $V_1$, $V_2$ and $V_3$ relative to the ground level. The acceleration voltage per electrostatic lens stage is approximately 30 kV, which means the three-stage electrostatic lens arrangement provides a total acceleration voltage of about 100 keV. If the number of stages for electrostatic lenses is increased to 6 or to 10, then the final acceleration energy for the electron beam will be about 200 keV or 300 keV respectively. The range of acceleration voltages may be varied in steps of about 30 kV by selectively turning on and off acceleration voltages to lower stage electrostatic lenses. Acceleration voltage increments of as small as 50 mV (minimum changeable range) may be implemented by altering a standard voltage of a voltage transformer that generates the voltage applied to the last-stage electrostatic lens ($V_3$ in the example of FIG. 4) relative to the ground level.

Figure 5:
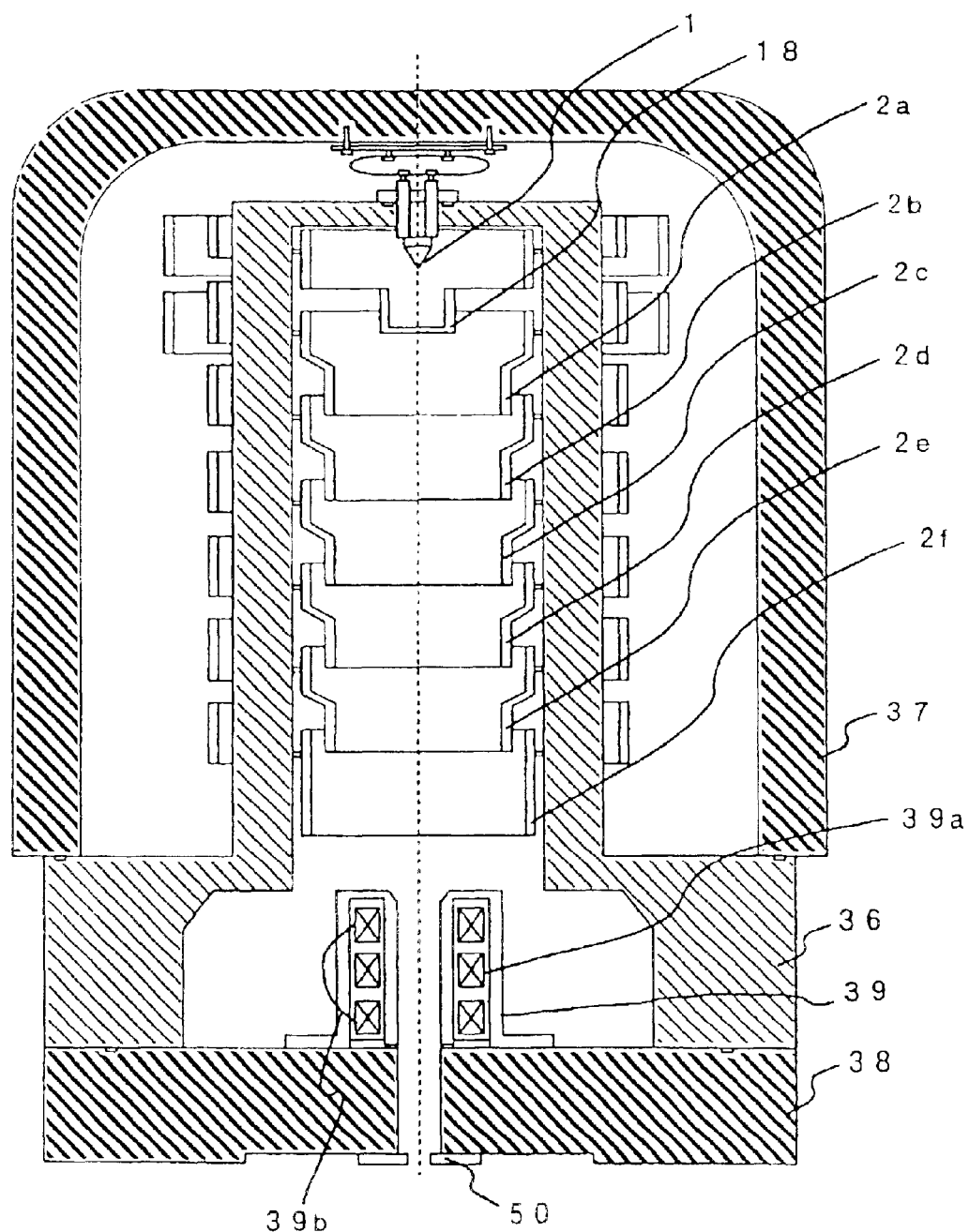
FIG. 5 is a schematic view depicting a typical structure of an electron gun in the STEM of FIG. 1.

FIG. 5 schematically depicts how electrostatic lenses and other components are illustratively arranged in an electron gun. The electron gun is shown incorporating an electron source 1, a first anode 18, and electrostatic lenses 2a through 2f in a six-stage arrangement inside an accelerating tube vacuum vessel 36.

An accelerating tube evacuating vessel 38 is located under the-accelerating tube vacuum vessel 36. The evacuating vessel 38 is furnished with a port of connection (not shown) to a turbo molecular pump, an ion pump or the like. When installed, such a vacuum evacuating pump evacuates the inner space of the accelerating tube vacuum vessel 36 to an extreme high vacuum on the order of $10^{-9}$ Pa. Outside the accelerating tube vacuum vessel 36 is a housing 37 that contains an insulating gas such as sulfur hexa-fluoride.

Above the accelerating tube evacuating vessel 38 is an electron gun deflector 39 that axially aligns the electron beam inside the electron gun.

Described below is how the electron gun deflector 39 is operated to align axially the electron beam within the electron gun. The electron gun deflector 39 comprises a scanning deflector 39a and two-stage deflectors with reversal polarity 39b located above and-below the scanning deflector 39a. Each of the deflectors has an X- and a Y-axis direction deflector coil. The electron gun deflector 39 is fed with a deflection signal for scanning the electron beam two-dimensionally at a TV-scan rate or a lower rate. In this setup, a deflection signal supplied to the deflector coil 12 is switched over for use as a deflection signal to the scanning deflector 39a. Since the axial alignment of the electron beam in the electron gun does not occur simultaneously with the scanning of the specimen using the electron beam, a single scanning signal generating circuit may be set up to generate an electron beam scanning signal (for shared use). The scanning signal from the scanning signal generating circuit may be switched alternately to the axial aligning process or to the specimen scanning process for use therein.

The scanning deflector 39a is a single-stage deflector with a region of electron beam deflection of about 3 mm. The deflection needs to be such that the diameter of an differential evacuation aperture 50 will be exceeded. The exciting currents to the converging and objective lenses are set to zero in order to find that location (physical) on the objective lens 4 which is illuminated by the electron beam from the electron source 1. The electron beam deflected by the electron gun deflector 39 is shielded, if the amount of deflection turns out to be high, by the differential evacuation aperture 50 at the bottom of the vessel 38. If the amount of deflection is small, the electron beam passes through the differential evacuation aperture 50 to reach the objective lens 4.

Arriving at the objective lens 4, the electron beam hits an upper pole piece of the objective lens 4 to generate secondary electrons therefrom provided the range of electron beam deflection is greater than the diameter of that upper pole piece. If the range of electron beam deflection is smaller than the diameter of the upper pole piece, the beam passes therethrough without generating secondary electrons from illumination. Thus when a secondary electron image is displayed by detecting the intensity of secondary electrons in synchronism with the scanning of the electron gun deflector 39, the positions of the electron beam and of the objective lens relative to the optical axis emerge as bright and dark concentric circles. The two-stage deflectors with reversal polarity 39b are then used to align the vertical position and the tilt angle of the electron beam relative to the optical axis.

The deflectors with reversal polarity 39b make up a two-stage upright arrangement. During alignment, the electron beam is vertically moved relative to the optical axis by resorting to two-stage deflection with reversal polarity and by supplying the same exciting current to each of the two deflectors. The tilt angle of the electron beam relative to the optical axis is adjusted by establishing an upper-to-lower deflection amount such that a point (lower pivot position) at which the electron beam deflected by the lower coil of the deflectors 39b intersects the optical axis will become the exact center of the differential evacuation aperture 50. When the dark-and-bright pattern of the secondary electron image observed through electron beam scanning by the electron gun deflector 39 is adjusted to coincide with the center of the displayed image, the electron beam from the electron source 1 is aligned with the optical axis of the objective lens 4.

In the manner described, the electron gun deflector is used once for electron beam alignment with the optical axis, and values representing the conditions in effect after the alignment are stored into a storage device (not shown) as instructed by the CPU 14 through the interface 15. Upon observation of a specimen, the condition values are retrieved from the storage device so that operating conditions of the microscope components are set up accordingly. This allows the microscope to start up and go into an observable state quickly. The swiftness with which the machine gets ready for use provides excellent usability as opposed to conventional TEMs. Because A/D and D/A converters are employed, the conditions determined and stored are reproduced more dependably than before. This significantly reduces the frequency with which axial alignment needs to be adjusted.

The interface 15 and the CPU 14 may be furnished generally by a personal computer (PC). Where the scanning transmission electron microscope is designed to have its components controlled by use of a PC, the axial alignment of an electron beam upon on-site assembly of the machine may be accomplished by qualified service personnel issuing instructions from a PC screen while turning a knob of a rotary encoder as needed. Where only qualified service personnel are allowed to perform axial alignment, an axial alignment icon on the PC screen may be arranged to demand entry of a password (e.g., personal ID) when manipulated. Such arrangements relieve the user of the chores of taking on axial alignment.

Figure 6:
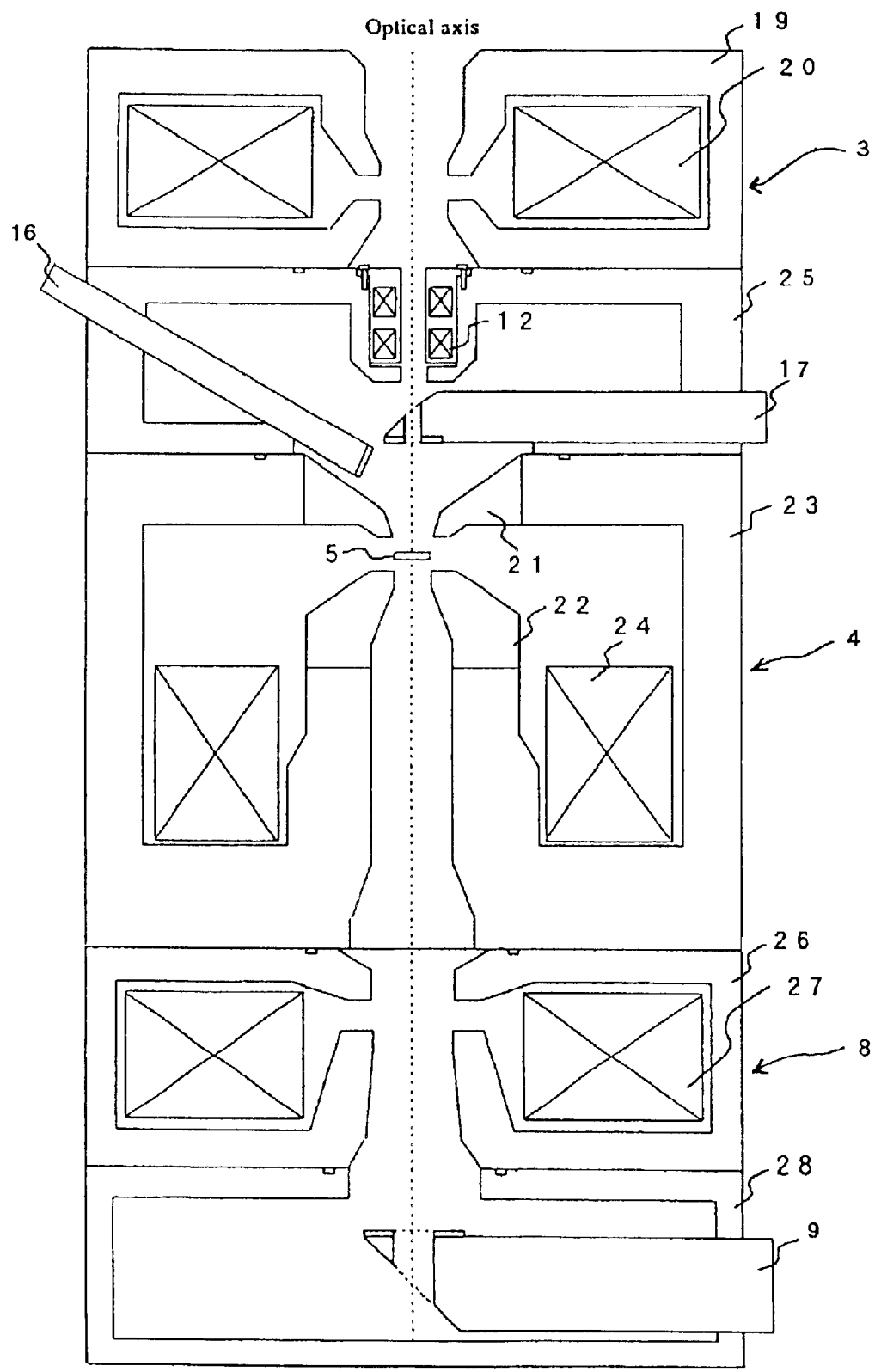
FIG. 6 is a schematic view showing components ranging from converging lenses to a scattered electron detector in a scanning transmission electron microscope (STEM) practiced as another embodiment of this invention.

Described below is a layout of those detectors in the scanning transmission electron microscope which detect electrons scattered or reflected by the specimen 5 upon electron beam illumination thereto, or secondary electrons released anew from the specimen 5 following the illumination. FIG. 6 illustrates an electromagnetic lens circuit, lens coils and detectors in conjunction with a single-stage projection lens 8. The lenses are stacked in the vertical direction. A spacer 25 is interposed between a converging lens 3 and an objective lens 4. The converging lens 3 is made up of a condenser lens magnetic circuit 19 and a condenser lens coil 20, while the objective lens 4 is composed of an objective lens upper pole piece 21, an objective lens lower pole piece 22, an objective lens magnetic circuit 23 and an objective lens coil 24. The spacer 25 accommodates a secondary electron detector 16 and a reflected electron detector 17. The spacer 25 is provided not only to secure space for the detectors installed, but also to exert shielding effects against an external alternating magnetic field because the spacer is made of permalloy. The spacer 25 also allows the deflector coil 12 to be installed.

The secondary electron detector 16 is oriented toward the specimen 5 along the upper surface tilt of the objective lens upper pole piece 21. Thus positioned, the detector 16 detects secondary electrons extracted above the objective lens upper pole piece 21 by a magnetic flux of the objective lens 4. Inside the secondary electron detector 16 is an electrode supplied with a high voltage of about 10 kV. The electrode is electrically grounded using an insulator or the like, the grounding being independent of the electrical ground of the microscope.

An electric field formed by the electrode in the secondary electron detector 16 extracts secondary electrons from the specimen and moves them closer to the detector body to improve detection efficiency. The reflected electron detector 17 is located in parallel with the top of the objective lens magnetic circuit 23. Because a detecting tip of the reflected electron detector 17 is located on the optical axis, the tip has a through hole about 1 mm across centering on the optical axis so that the hole allows the electron beam to pass through. Under the objective lens 4 is the projection lens 8 made up of a projection lens magnetic circuit 26 and a projection lens coil 27. Under the projection lens 8 is an inner space of the vacuum vessel 28 accommodating the scattered electron detector 9 located on the optical axis. As with the reflected electron detector 17, the scattered electron detector 9 has a detecting tip that has a through hole about 3 mm across centering on the optical axis so as to permit the transmitted electrons to pass through, whereby only the scattered electrons are detected.

FIG. 7 is a schematic view indicating approximate dimensions of the objective lens 4. The coil (of about 1,800 turns) 24 measuring approximately 180 mm$\phi$ in outer diameter, 80 mm in inner diameter and 75 mm in elevation is housed inside a pure-iron magnetic circuit 23 for rotation having a diameter of 230 mm$\phi$. In the innermost portion of the magnetic circuit 23 are the pole pieces 21 and 22 about 60 mm in outer diameter each. The pole pieces 21 and 22 are formed by a high-permeability magnetic material called parmender. Because the shapes of the pole pieces 21 and 22 determine the performance of the objective lens 4, deciding on dimensions "a" "b" and $\theta$ in FIG. 7 requires careful consideration. Depending on the design performance of the lens, the dimensions are set approximately to 1.5 to 16 mm$\phi$ across for the diameter "a" 3 to 10 mm for the portion "b" and 10 to 20 degrees for the angle $\theta$. Where an electron beam with an acceleration voltage of 200 kV is used, the coil 24 is made to carry a current of about 7A to excite the objective lens 4. In that case, a lens magnetic field with a magnetic flux density of about 1.5 T is formed between the pole pieces of the objective lens 4. A liquid coolant cooled to 12 to 13° C. circulates through the objective lens 4 to prevent excess temperature rise.

Figure 8:
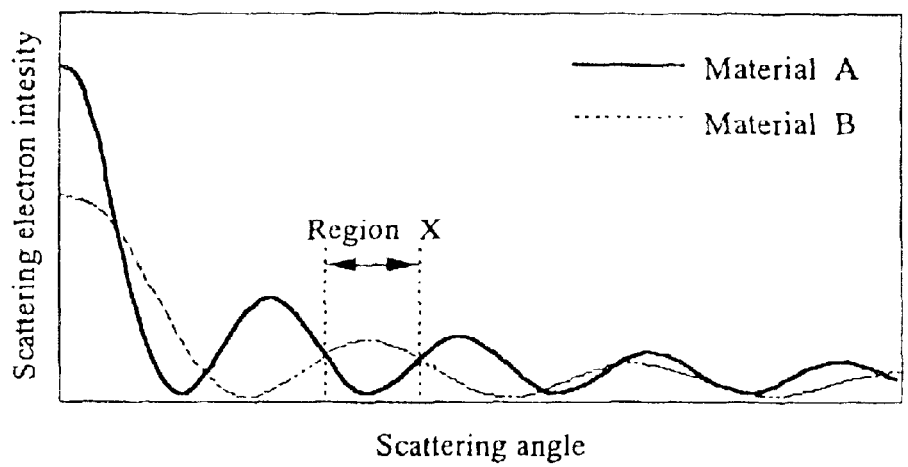
FIG. 8 is a graphic representation illustrating differences in angular distribution of scattering intensity between different materials.

Described below are ways to change the range of detection angle for scattered electrons in order to enhance a contrast of a scanning transmitted image of a target portion to be observed. FIG. 8 is a graphic representation illustrating differences in angular distribution of scattering intensity between different kinds of materials, A and B. The differences concern all properties of each material: crystal structures, kinds of component atoms, chemical composition, etc. The material A is shown to have higher scattering intensities at most scattering angles than the material B. This is a phenomenon often observed when the material A has a greater atomic number than the material B. Inside a region X in FIG. 8, however, the material B has a higher scattering intensity than the material A. That characteristic may be utilized to observe a specimen wherein the materials A and B are mixed. That is, establishing the range of detection angle for scattered electrons in the region X allows information about the material B to be extracted with a high contrast.

What follows is a description of how to determine kinds of component atoms within and a chemical composition of a specimen based on an acquired scanning transmission image intensity. A scanning transmitted image of the specimen is first obtained using the above-described scanning transmission electron microscope (STEM). At this point, the range of detection angle for scattered electrons is determined as follows: exciting currents to the first and the second stage projection lens 8a and 8b as well as a diameter of the objective aperture 11 are set so that the target portion to be observed will have a high contrast. The CPU 14 retrieves stored values representing image acquisition conditions. Based on the retrieved values, the CPU 14 calculates values of exciting currents destined for the first and the second stage projection lens 8a and 8b to obtain the focal length of each lens. When the magnification of an electron diffraction pattern (i.e., a minimum range for detecting scattered electrons) is calculated, the calculated value is recorded along with the image obtained.

The acquired scanning transmitted image is analyzed as follows: input first is information as to which stage of the objective aperture 11 has been used (i.e., diameter of the aperture). Input next are elements of supposition that may be included in the acquired image as well as their crystal structures. With these conditions entered, the CPU 14 computes a scattering intensity using as a parameter the stored range of detection angle for scattered electrons, the range having been stored in conjunction with the scattering transmitted image.

The computing by the CPU is followed by designation, in the image file, of a specimen portion wherein types of component elements and their crystal structures are known; these component elements and crystal structures are input. If there are no known kinds of elements or crystal structures, then an image file is prepared using known elements and crystal structures observed under the same conditions as those for the target specimen; the contents of the prepared image file are used as reference data against which the scattering intensity of the input elements under the same observing conditions is corrected.

A target portion to be analyzed is designated in the image file. The target portion may be selected in terms of points, lines or areas. If data denoting the component elements and crystal structures about the designated target portion coincide with any of the previously input data on component elements and crystal structures, a message appears pointing out the data match. If there exist no matching data, another message is displayed to prompt the entry of data about the next candidate element. The operation is repeated until the composition of elements and the crystal structures of the target portion to be analyzed have become known.

Described below are ways to calculate and correct scattering intensities used in the above-described analysis. Where the types of component elements and crystal structures constituting the specimen are known, it is possible to calculate the scattering intensity of interest based on the so-called kinematic scattering theory or dynamic scattering theory. The kinematic scattering theory applies only to those materials having an amorphous structure. The dynamic scattering theory, on the other hand, is applicable to calculations of amorphous structures having a long range order as well as to crystal structures. The calculating time according to the kinematic scattering theory is extremely short compared with the computing time based on the dynamic scattering theory. For that reason, the calculating and correcting methods based on the kinematic scattering theory should be selected when approximate solutions are needed quickly; the methods as per the dynamic scattering theory need to be selected if more accurate solutions are required.

The kinematic scattering theory presupposes that electrons are scattered only once by a specimen and that the probable angular distribution of scattered electrons is proportional to the square of an atomic scattering amplitude of the scattered electrons. On these assumptions, the scattering intensity is determined solely by the kinds of elements making up the specimen.

The calculations based on the dynamic scattering theory are somewhat complicated. A technique called multislice is used for the calculations. The multislice technique presupposes that a specimen is constituted by a stack of thin slices about 0.5 nm or less in thickness each. Diffraction and propagation of electrons through each of the slices are calculated repeatedly. When all slices constituting the specimen have completed the calculations, a wave function of the electrons is subjected to Fourier transformation. The result is squared to provide a scattering intensity. Given an unknown material, one of the two scattering theories above is used to calculate the scattering intensity which in turn is used as a basis for analyzing the composition and crystal structure of the material of interest. It should be noted that because the scattering intensity thus calculated is an intensity relative to an incident electron beam, the intensity of the incident electron beam must be corrected first.

The intensity of the incident electron beam is corrected with reference to the above-mentioned image file containing values regarding known elements and crystal structures. For example, if the measured intensity value is 100 in the image file while the calculated value is 10 percent of the incident electron beam (e.g., 0.1), then the coefficient for correction is 1,000. This correction coefficient is applied commonly to all input elements of the target to be analyzed.

Where the kinds of component atoms or crystal structures of the target to be observed are already known, the input of such component atoms or crystal structures allows the angular distribution of scattered electrons to be calculated. The result of the calculation is displayed on the PC screen. A desired angular position is then selected from within the displayed angular distribution of scattered electrons. This determines a condition of excitation for the projection lens with respect to the detection angle condition of interest, whereby a current value for the projection lens is established. In this manner, the contrast of the target portion to be observed may be enhanced or reduced as desired.

An application of the analysis of image contrast will now be described. For advanced devices, one of the factors that determine whether a given device is faulty or acceptable in characteristics is the density distribution of a dopant injected into the substrate. Illustratively, phosphorus (P) is used in silicon devices. The density distribution of phosphorus is analyzed as a contrast of a scanning transmitted image by use of differences in electron scattering power between silicon (Si) and phosphorus (P).

Silicon used in the substrate is single crystal in composition. An electron beam entering the substrate in the direction of its crystal orientation undergoes a strong Bragg reflection at low scattering angles. This brings about a scattering intensity distribution with high scattering intensities within a range of low scattering angles. If the scattered electrons that fall within the range of low scattering angles are selectively guided to the detector, a scanning transmitted image with a highlighted silicon contrast is obtained. Thus the scattered electrons within the range of low scattering angles are excluded from the target of detection when a distribution of phosphorus density in the silicon substrate is to be observed. To exclude the scattered electrons at low scattering angles involves reducing the exciting current to the projection lens and shortening the camera length (i.e., to reduce the magnification of the electron diffraction pattern) so as to prevent the electrons in question from being detected by the detector. The procedure above allows only high angle scattering components to be detected. In the resulting scanning transmitted image, contrasts of component elements are known to be proportional to their atomic numbers.

That is, the contrast of silicon appears brighter than that of phosphorus because the atomic number of silicon is the greater. Since the overall contrast of the image is proportional to the average composition of phosphorus and silicon, the contrast varies linearly from the high to the low density portion of phosphorus. Thus the density of phosphorus in a silicon substrate is analyzed by comparing two contrasts: the actually measured contrast of the substrate; and a contrast between an image of scattering power distribution in the silicon substrate measured under the same imaging conditions on the one hand, and an image of scattering power distribution in a specimen from a silicon substrate doped with phosphorus at a known density on the other hand. A linear interpolated line is drawn between the images for comparison and analysis.

Figure 9:
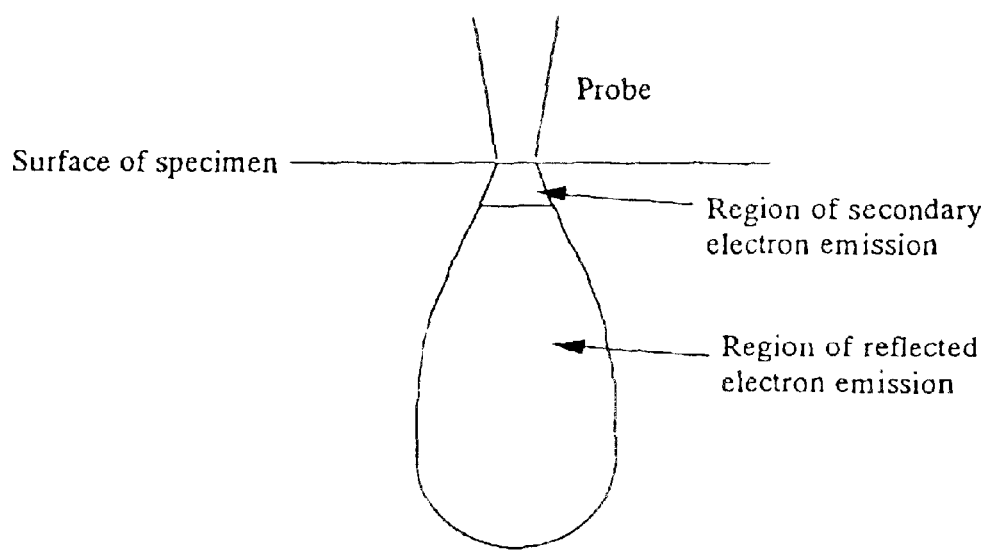
FIG. 9 is a schematic view showing those regions in a bulk specimen which emit secondary and reflected electrons.

Described below is how to observe internal structures of specimens three-dimensionally using secondary or reflected electrons. An electron beam entering a bulk specimen spreads in a teardrop fashion representing a region of reflected electron emission, as shown in FIG. 9. The higher the acceleration voltage for the primary electron beam (probe), the deeper the region of reflection electron emission. Illustratively, an acceleration voltage of 200 keV for a primary electron beam results in a region of arrival several micrometers deep. The energy of secondary electrons stemming from the emission of the primary electron beam ranges from about 50 eV to hundreds of eV; secondary electrons occur solely within a region approximately up to 10 nm from a surface spot penetrated by the electron beam. These secondary electrons are detected and formed into a scanning image by conventional low accelerating voltage scanning electron microscopes. The scanning image constitutes a secondary electron image.

Simultaneously with the generation of secondary electrons, part of the primary electron beam is reflected inside the specimen. The energy of the reflected electrons remains unchanged at 200 keV if the energy loss inside the specimen is ignored. The electrons intruding into the specimen are reflected from inside and emitted as reflected electrons (or as secondary electrons formed near the specimen surface). The reflected or secondary electrons are detected by a secondary charged particle detector whereby a high-accelerating voltage scanning electron microscope image is obtained.

Where the high-accelerating voltage scanning electron microscope is used, the yield of secondary electrons reflects not only information about the specimen surface but also information about an internal structure of the specimen, as described. It is thus possible to extract three-dimensional information about the interior of a specimen using a high-accelerating voltage scanning electron microscope to observe a secondary or a reflected electron image of the specimen.

The reason for reflected or secondary electron image thus observed to appear visually in a three-dimensional manner will now be described. Consider a case in which, as shown in FIG. 10, a foreign matter is included in a specimen and a primary electron beam (probe) is emitted to points A, B and C in the specimen.

Point A appears bright because the foreign matter at this point is located closest to the specimen surface and leaves secondary charged particles with a strong signal intensity. Point C appears dark because the foreign matter at this point is deep inside the specimen, allowing secondary charged particles to have only a weak signal intensity. Changes in contrast occur in the depth direction of the specimen. When a scanning image is made of an internal structure of the specimen for observation, the image is seen apparently with a depth. The deeper the observed position from the specimen surface, the lower the spatial resolution of the matter, so that an image with an apparently three-dimensional perspective viewed from above is observed.

Figure 11:
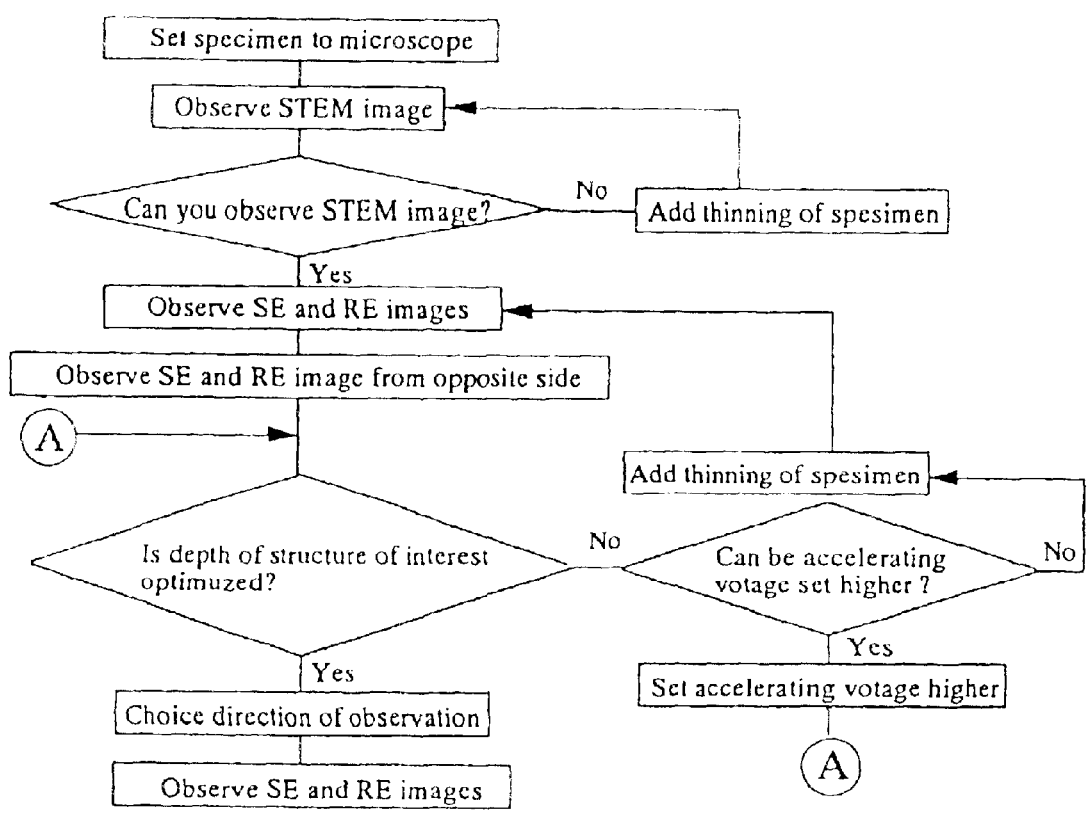
FIG. 11 is a flowchart of steps for observing a projected image of a specimen structure based on a scanning transmitted image of a specimen, and for observing a three-dimensional image of the specimen using its secondary and reflected electron images.

How three-dimensional observation is carried out will now be described with reference to the flowchart of FIG. 11. Initially, a specimen thinned by mechanical polishing and ion thinning (or by emission of focused ion beam) is set in a specimen-observing vessel of the scanning transmission electron microscope to observe a scanning transmitted image. If a scanning transmitted image is difficult to observe, that means the specimen needs to be thinned further to let more electrons pass therethrough. In that case, the specimen is additionally thinned.

The image observation and the additional thinning of the specimen are carried out repeatedly, until an acceptable scanning transmitted image can be observed. The observation of the scanning transmitted image is followed by that of a secondary and a reflected electron image of the specimen. Thereafter, the specimen is inverted in its position for another observation of a secondary and a reflected electron image. By this time, a projected image of the overall specimen structure is acquired from the scanning transmitted image above, and so is information about a three-dimensional structure of the specimen down to certain depths as viewed from its face as well as from its reverse side based on the secondary and reflected electron images. If it is judged that the three-dimensional structure as observed in the secondary and reflected electron images is not deep enough relative to the overall specimen structure, then another observation of a secondary and a reflected electron image is carried out by raising the acceleration voltage of the primary electron beam. With the acceleration voltage at its highest setting, it may turn out that the depth of the structure observed in secondary and reflected images is not yet sufficient. In that case, the specimen is thinned additionally.

As described, the invention envisages thinning specimens using a focused ion beam. This feature is implemented in the form of a specimen holder structure for shared use by ion beam thinning equipment for specimen thinning and by the inventive STEM (scanning transmission electron microscope). A typical specimen holder structure and a matching specimen stage structure are described below.

FIG. 15 schematically shows a typical setup of a specimen holder and a specimen stage designed for shared use by a scanning transmission electron microscope and by specimen thinning equipment utilizing FIB (focused ion beam). The specimen stage comprises a specimen drive for X-direction 45, a specimen drive for Y-direction 46, a specimen drive for Z-direction 47 (the three drives constituting a triple-direction drive system), and a specimen holder tilt system 48. These components are controlled by a stage controller 49. For observation of a scanning transmission electron microscope image, a primary electron beam is emitted onto a specimen 5 in the negative Z-direction. For FIB machining of the specimen 5, a focused ion beam (FIB) is emitted in the positive Y-direction.

The direction of additional thinning on the specimen starting from its face or from its reverse-side is determined by viewing secondary and reflected electron images acquired from the two sides. If an acquired three-dimensional image is judged to be deep enough based on the observed secondary and reflected electron images, then the specimen holder tilt system 48 is activated to change the tilt angle of the specimen 5. The specimen tilt angle is varied in order to acquire secondary and reflected electron images observed in different directions. A plurality of images thus acquired in diverse directions are put together for observation purposes.

Figure 12:
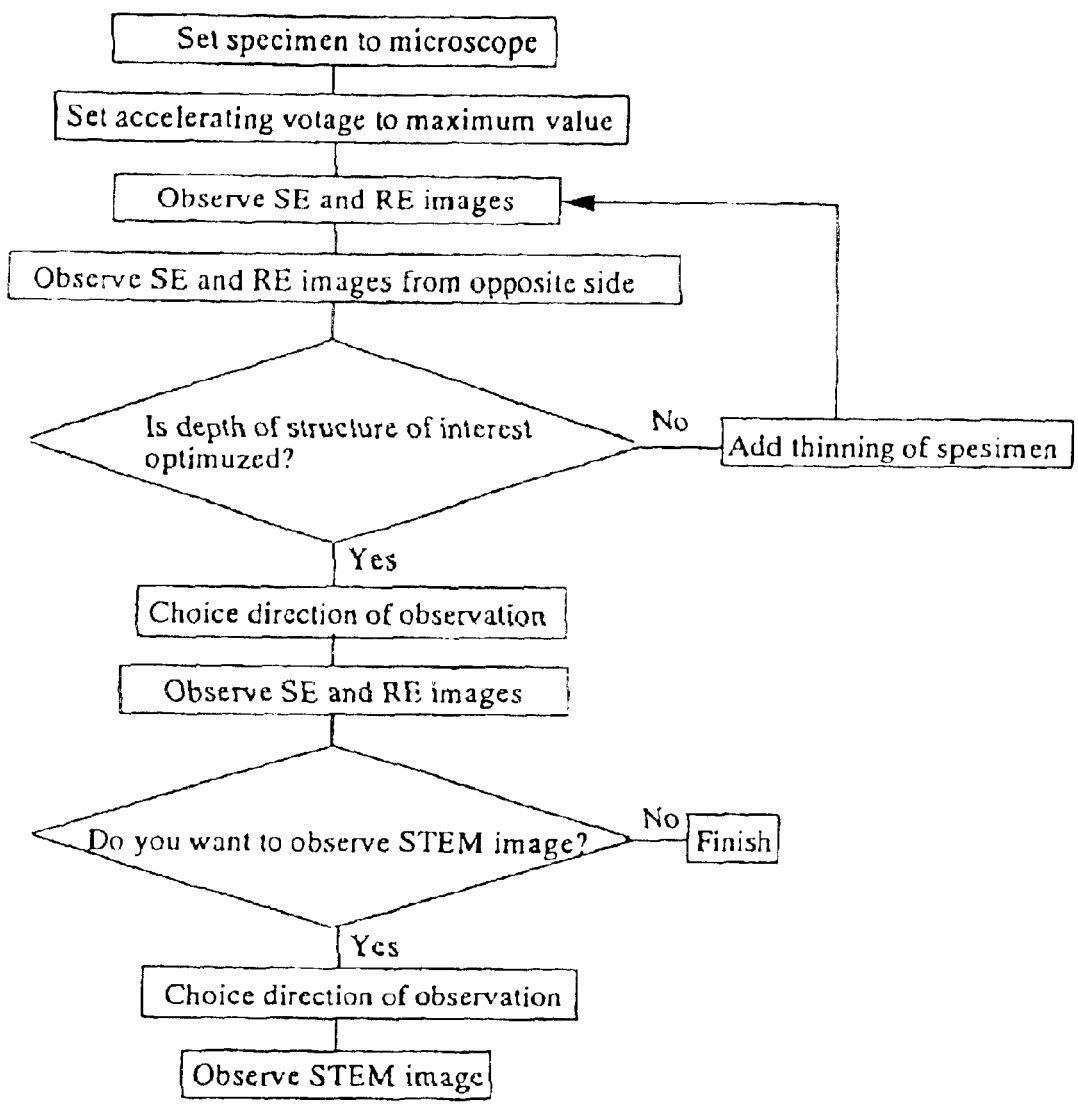
FIG. 12 is a flowchart of steps for observing a three-dimensional image of a specimen using its secondary and reflected electron images.

The procedure above is effective where some aspects of the specimen structure are already known or where observation of scanning transmitted images of the specimen is needed. If the specimen structure is unknown or if the observation of a scanning transmitted image is not mandatory, then the specimen is observed three-dimensionally in accordance with the flowchart of FIG. 12. In this case, the acceleration voltage of the primary electron beam is set for a maximum from the start, and a secondary and a reflected electron image of the specimen are observed from both sides thereof. A check is made of the observed images to-see if the target depth of the specimen has been properly observed three-dimensionally. If the result of the check is satisfactory, the specimen holder tilt system 48 is activated to change the direction of observation for another three-dimensional image observation as in the preceding procedure.

If the target depth of the specimen has yet to be reached by observation with three-dimensional images, the specimen is thinned further. After the additional thinning, the specimen is again observed in secondary and reflected electron images. At this point, it is judged whether an adequate three-dimensional image of the target depth has been obtained, i.e., whether additional thinning of the specimen is needed. The process is repeated until the target depth of the specimen is properly observed three-dimensionally. If further observation of the specimen with scanning transmitted images is deemed necessary, the observing process is continued.

An application of a three-dimensional observation will now be described. Semiconductor devices, for example, are often observed for such target locations as failed bits. When a specific location of a specimen is to be observed in a scanning transmitted image, that location is thinned using a focused ion beam. During the specimen thinning process, an overall specimen structure is checked and a currently machined depth of the specimen is verified repeatedly by observation with secondary and reflected electron images in accordance with the flowchart of FIG. 11.

The overall structure check and the depth verification repeated as outlined above make it possible ultimately to fabricate a specimen containing only such structures as gates and capacitors. These structures may then be observed three-dimensionally.

Described above with reference to FIG. 12 were observations with secondary and reflected electron images obtained by scanning a specimen using a high accelerating voltage electron beam. Such observations permit visually scrutinizing an internal structure of a thick specimen on the micrometer order; specimens of that kind are too thick to be observed by a conventional transmission electron microscope. Observations based on the high accelerating voltage electron beam thus make it possible to have three-dimensional verification of overall structures in thick targets such as contacts in devices.

Below is a description of a typical layout of a secondary electron detector based on a secondary electron detecting technique for improving the yield of secondary electrons. Secondary electrons are extracted from the specimen and moved above the objective lens by a magnetic flux of the pre-field objective lens that plays the part of demagnifying the primary electron beam. In this setup, the secondary electron detector is located above the objective lens as mentioned earlier. Although the secondary electron detector located over the objective lens improves the yield of secondary electrons, the detector location is limited so as to provide passage for the primary electron beam. Positioned close to the secondary electron detector is an electrode supplied with a voltage for extracting secondary electrons. The higher the extracting voltage fed to the electrode, the greater the yield of secondary electrons. However, an excessively high extracting voltage can have adverse effects on the trajectory of the primary electron beam. Where to locate the secondary electron detector and how much voltage to feed to its electrode are factors that need careful consideration.

One way to study the location of the secondary electron detector with its electrode positioned nearby is by simulating a trajectory of secondary electrons in a setup that covers both the magnetic field of the objective lens and the electric field of the extracting electrode close to the detector. With the position of the specimen regarded as an electron source, the energy of the secondary electrons therefrom is suitably postulated and their trajectory is calculated accordingly. The magnetic flux density of the objective lens on the optical axis is known to have a major effect on the trajectory of secondary electrons. Thus if a magnetic flux distribution of secondary electrons is computed beforehand using the finite element method, the trajectory of the secondary electrons above the objective lens is obtained. After that, the effect of the electric field of the extracting electrode on the trajectory of the primary electron beam is calculated. The results of the calculations are used to determine where to locate the detector with respect to secondary electrons having a given level of energy. Similar calculations are made for secondary electrons having different levels of energy so as to find hypothetical energy distributions of the secondary electrons. The processes above help determine an optimized position of the secondary electron detector together with its optimized dimensions.

Furthermore, the above calculations may be performed using as a parameter the voltage fed to the electrode for extracting secondary electrons. This additional computing makes it possible to determine in more detail the optimized position of the secondary electron detector and its optimized dimensions in keeping with the supplied voltage.

Another way to improve the yield of secondary charged particles is by utilizing a deflector having an electric field E and a magnetic field B (usually called an E×B filter or a Wien filter). This deflector deflects secondary electrons from a specimen in the direction of a secondary electron detector without adversely affecting the trajectory of the primary electron beam. The removal of the adverse effects is made possible when the electric field E and the magnetic field B are arranged to cancel out their influence with regard to the primary electron beam.

Figure 13:
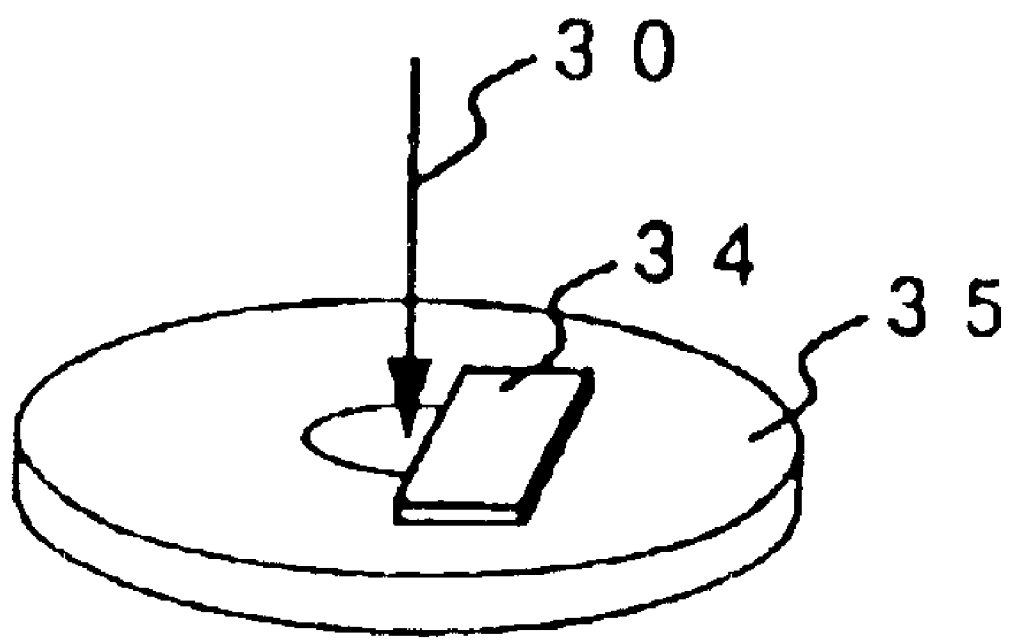
FIG. 13 is a schematic view of a specimen and a structure for holding it with a view to acquiring an optimal defocus amount based on scanning transmission image intensities.

Described below is a technique for setting an optimized defocus amount in forming a fine probe on the basis of scanning transmitted image intensities. FIG. 13 shows a specimen holding structure used for this technique. A mesh 35 for holding a specimen is a donut-shaped metal plate which is illustratively made of molybdenum (Mo) and which measures approximately 3 mm$\phi$ in outer diameter, 0.5 mm$\phi$ in inner diameter and 0.2 mm in thickness. A crystal specimen 35 thinned for observation with a scanning transmitted image is bonded by adhesive or the like on top of the donut-shaped mesh 35 in such a manner that about half the center opening is covered. Although not limited in terms of material, the crystal specimen 34 should preferably have its crystal axis oriented in parallel with the incident direction of an electron beam 30. The lattice distance of the specimen 34 should be known in advance. In operation, the electron beam 30 is arranged to enter an edge of the crystal specimen 34 for the observation of a scanning transmitted image at an interface between the specimen and a vacuum space.

Figure 14:
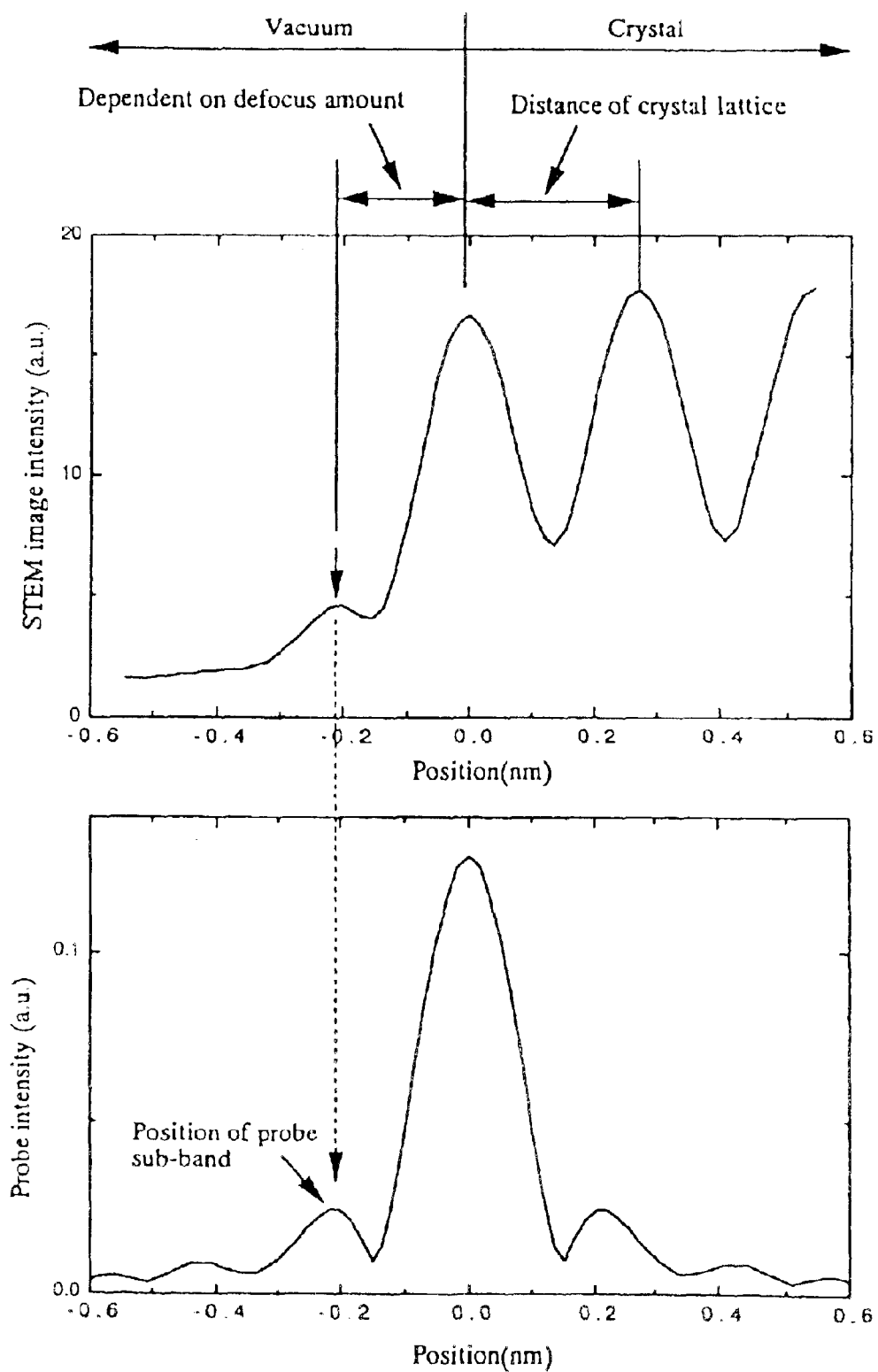
FIG. 14 is a graphic representation for explaining ways to acquire an optimal defocus amount based on scanning transmission image intensities.

Preparatory to observation, the specimen unit shown in FIG. 13 is set in the scanning transmission electron microscope. An edge of the crystal specimen 34 close to the vacuum is viewed in a scanning transmitted image at a 3,000,000× magnification for high-resolution observation. This reveals a bright-and-dark contrast of a scanning transmitted image portion inside the specimen in keeping with the crystal lattice distance. Outside the specimen edge (i.e., in the vacuum space), as shown in FIG. 14, scattered electrons are also observed to peak in intensity.

The position in which the scattered electrons peak in intensity in the vacuum space is dependent on the defocus amount of the probe (i.e., primary electron beam). The peak position shifts perpendicularly to a vacuum interface (i.e., specimen edge) in accordance with the defocus amount. If focusing is correct with no diffraction aberration or spherical aberration (with no defocus), there should be no intensity signal of scattered electrons observed outside the specimen edge. In practice, various aberrations lead to the observation of an intensity signal of scattered electrons outside the specimen edge as illustrated in FIG. 14.

It follows that the state of focusing may be judged based on where a scattered electron intensity signal appears outside the specimen edge. That is, an under-focus is recognized if an intensity signal of scattered electrons appears inside a given point F (i.e., on the specimen side); an over-focus is detected if the scattered electron intensity signal is found outside the point F (on the vacuum side).

The scattered electron intensity signal appearing outside the specimen edge is a consequence of the sub-band position of the probe (primary electron beam) occurring in the scanning transmitted image. The sub-band position reflecting a defocus amount may be measured quantitatively in reference to the lattice difference of the crystal specimen, and a divergence between the sub-band position and an optimized defocus amount for forming a fine probe may be calculated. When the exciting current to the objective lens is modified so as to correct the divergence thus calculated, an observation with the optimized defocus amount is made possible. With the optimized defocus amount kept unchanged, the current specimen may be replaced by another specimen whose height may be adjusted for optimal focusing. This permits observation of a desired specimen with an optimized defocus amount.

The optimized defocus amount mentioned above is further explained below. The resolution of a scanning transmission electron microscope is determined by its probe diameter. The probe diameter varies with defocus amount. The optimized defocus amount refers to the amount of defocus at which the resolution is the highest, i.e., the probe diameter is the smallest. The optimized defocus amount is zero where an ideal objective lens with zero spherical aberration coefficient is used. In practice, objective lenses have their inevitable spherical aberrations. In the circumstances, defocusing is carried out to balance diffraction aberration with spherical aberration, whereby the probe diameter is minimized. Since spherical aberration is specific to each microscope, each machine has its own optimized defocus amount.

If Cs stands for the spherical aberration coefficient of an objective lens and λ for the wavelength of an electron beam, then an optimized defocus amount Δf is given by the following equation:

$$\Delta f = -\sqrt{Cs \cdot \lambda} \quad (1)$$

The intensity profile of the probe χ(u) is obtained by subjecting a function defined by equation (2) below to Fourier transformation and by squaring the transformed result, where "u" denotes a spatial frequency. The profile thus acquired permits calculating the sub-band position of the probe having an optimized defocus amount.

$$\chi(u) = \text{Exp}[-i \cdot \pi \lambda \{(\tfrac{1}{2}) Cs \cdot \lambda^2 u^2 + \Delta f\}] \quad (2)$$

Comparing the result of the calculation above with an actual measurement provides a divergence from the optimized defocus amount. The divergence value thus obtained is fed back to the microscope for correction.

As described above in detail, the scanning transmission electron microscope according to the invention dispenses with those time-consuming chores of axial alignment which required experience and expertise. Users are relieved of the tedious task of alignment, and the speed of measurement and observation with the microscope is boosted.

According to the invention, the range of detection angle for scattered electrons is selected by changing the exciting current to the projection lens. This improves the contrast of the target portion to be observed in a scanning transmitted image.

From the features described above, the following practical benefits are derived:

(1) A resolution of 0.24 nm is made available on a monitor screen.

(2) Observations are made and images are recorded with the microscope installed in a well-lighted room. A dark room is no longer necessary.

(3) An insulating film of semiconductor devices (e.g., gate oxide film) is observed with a high contrast using a conventional TEM method.

(4) An ultra-thin film on the nanometer order is directly measured with the microscope.

In addition, because the inventive scanning transmission electron microscope is controlled by a personal computer (PC), a PC screen is used to issue instructions for image transmission, filing, comment entry, measurement and printing through digitally displayed images. The screen-driven order input provides the machine with excellent usability.

Upon acquisition of an image, the imaging parameters determined by the exciting current to the projection lens are automatically analyzed by the CPU and recorded in conjunction with the acquired image. The stored parameters are retrieved and used for subsequent structural and component analyses. This feature promises highly accurate analyses.

Secondary and reflected electron images may be obtained using an electron beam of a high accelerating voltage. This makes it possible for the internal structure of a specimen to be observed as an image having a three-dimensional perspective on the micrometer order.

A secondary electron image, a reflected electron image and a scanning transmitted image of a specimen may be observed in combination using a primary electron beam of a high accelerating voltage. This feature helps determine an appropriate amount and direction of corrective machining on a specimen.

While preferred embodiments of the invention have been described using specific terms, such description is for illustrative purposes only, and it is to be understood that changes and variations may be made without departing from the spirit or scope of the appended claims.

What is claimed is:

1. A scanning transmission electron microscopy apparatus, comprising:

an electron source for generating an electron beam;

an electron illuminating system for converging said electron beam from said electron source onto a specimen;

a specimen holder for holding the specimen;

a first electron deflecting system for scanning said specimen with said electron beam disposed between the specimen holder and the electron illuminating system;

a second electron deflecting system disposed between said electron source and said electron illuminating system;

a scattered electron detector for detecting scattered electrons transmitted through said specimen;

an interface for entering values of conditions for the electron beam alignment;

a scanning signal generating circuit for supplying a deflection signal to said second electron deflecting system based on the values entered through the interface, a secondary electron detector for detecting secondary electrons from the specimen; and means for displaying an image attributed to the secondary electrons from the specimen, wherein said second electron deflecting system aligns an axis of the electron beam based on the values entered through the interface; and wherein the second electron deflecting system is aligned by a way that the dark and bright pattern of the secondary electron image is adjusted to coincide with a center of the image attributed to the secondary electrons.

* * * * *